United States Patent [19]

Watanabe et al.

[11] Patent Number: 4,680,602
[45] Date of Patent: Jul. 14, 1987

[54] LIGHT EMITTING DIODE

[75] Inventors: Hisatsune Watanabe; Akira Usui, both of Tokyo, Japan

[73] Assignee: NEC Corporation, Tokyo, Japan

[21] Appl. No.: 647,744

[22] Filed: Sep. 6, 1984

[30] Foreign Application Priority Data

Sep. 6, 1983 [JP] Japan ............................ 58-163453

[51] Int. Cl.$^4$ ............................................ H01L 33/00
[52] U.S. Cl. .................................... 357/17; 357/16
[58] Field of Search ............... 357/17, 16, 61, 90; 372/43, 45, 44, 46

[56] References Cited

FOREIGN PATENT DOCUMENTS 0199277 12/1982 Japan ................................... 357/16

OTHER PUBLICATIONS

Applied Physics Letters, vol. 43, No. 11, Dec. 1, 1983, "High Efficient GaAlAs Light-Emitting Diodes of 660 nm With a Double Heterostructure on a GaAlAs Substrate," Ishigmo et al.

Primary Examiner—James W. Davie
Assistant Examiner—Georgia Y. Epps
Attorney, Agent, or Firm—Burns, Doane, Swecker & Mathis

[57] ABSTRACT

A high output light emitting diode (LED) includes an active layer of GaAsP and a window layer formed of either InGaP or InGaAsP. An LED having this structure has an enhanced optical output, and can be manufactured easily and at low cost.

14 Claims, 3 Drawing Figures

LIGHT EMITTING DIODE

BACKGROUND OF THE INVENTION

1. Field of the Invention

The present invention relates to a light emitting diode (LED) having gallium arsenide-phosphide (GaAsP) layer as an active layer, and more particularly to the inexpensive LED with an enhanced optical output.

2. Description of the Prior Art

A carrier injection type semiconductor light emitting diode has, as its great characteristic merit, a long life-time and a fast response. However, since an optical output of the general LED has been small due to a p-n homo junction structure, its application has been limited. In recent years, however, owing to improvements in the internal structure of the LED, more specifically in a multi-layer structure thereof, it has made a great stride in getting a high optical output, and so, there has appeared a possibility that the application area of the LED may be remarkably broadened. As examples of the new application, one can enumerate tail lamps of motor cars, traffic signals and neon signs.

The recently developed high optical output LED has a p-n hetero junction structure consisting of an active layer of gallium-aluminium arsenide (GaAlAs) and a window layer of GaAlAs having a larger band gap than that of the active layer and thereby suppressing absorption of output light (red) emitted from a light emitting region of the active layer through the window layer. More specifically, the GaAlAs window layer has a larger aluminium content than that of the active layer and is used as an electrode contact layer on an exit side of the output light. In addition to the above LED structure resorting a so-called window effect, a so-called double heterostructure has been proposed in order to realize a still further high optical output. In the known double heterostructure, an active layer of GaAlAs is sandwiched between a pair of confining layers of GaAlAs having large aluminium content than that of the active layer, and thereby confining injected carriers into the active layer. One of the confining layers also acts as a window layer by forming p-n hetero junction against the active layer.

However, such GaAlAs-LED has following problems in manufacture due to the fact that aluminium is extremely liable to be oxidized.

Firstly, as one problem in the step of crystal growth, a severe counter-measure for reducing residual oxygen (moisture) gas is necessitated so that aluminium may not be oxidized. Normally in epitaxial growth, a liquid phase growth process is employed, and the liquid phase growth process requires a great many severe attentions such as deoxidation of various jigs within a growth reaction tube as a matter of course, removal of residual oxygen in a carrier gas, prevention of minute air leakage, prevention of contamination of air upon charging and discharging a crystal, and preliminary baking of a raw material before growth. Such counter-measures would naturally result in reduction of a productivity, lowering of a yield and rise of a cost.

As a second shortcoming, even if growth of a high-quality crystal were to become possible, special counter-measures which are caused by the inclusion of easily oxidizable aluminium are also necessary in the steps before completing the LED. In any one of a high-concentration diffusion process for ohmic contact, an electrode applying process, a passivation process, a pelletizing process, a mount sealing process, etc., mixing of moisture and oxygen must be completely suppressed, and for that counter-measure a lot of expense is necessary.

Recently for the purpose of improving a mass-productivity of epitaxial growth, developments of an organic metal vapor phase epitaxial growth process have been made actively in place of the liquid phase epitaxial growth process. However, the above-described first shortcoming still remains and makes manufacture of a high-quality crystal difficult. From the above-mentioned view point, it has been desired to develop an LED with an enhanced optical output and a low manufacturing cost by eliminating aluminium content.

On the other hand, an LED using an active layer of GaAsP has been already put to practical use. This GaAsP-LED is manufactured starting from an epitaxial wafer in which a GaAsP layer is grown on a GaAs or GaP substrate through a halogen transport vapor epitaxial growth process, and it emits red to green light by changing the contents of phosphide. Since aluminium is not contained in the GaAsP-LED, it is easy to form a high-quality epitaxial layer through a vapor phase growth process. This GaAsP-LED has a merit that the manufacturing cost of the epitaxial layer can be suppressed extremely due to the fact that the vapor phase growth process has a high productivity.

SUMMARY OF THE INVENTION

An object of the present invention is to provide a novel structure of an LED having GaAsP active layer with a enhanced optical output which can be manufactured with a low cost.

According to one feature of the present invention, there is provided a GaAsP-LED in which GaAsP is used as an active layer and InGaP or InGaAsP is used as a window layer.

According to a more specific feature of the present invention, there is provided a surface light emitting diode comprising: a multi-layer semiconductor crystal having a p-n hetero junction structure consisting of an active layer of GaAsP and a window layer of either InGaP or InGaAsP, the window layer being exposed on the top surface of the multi-layer semiconductor crystal and having lattice misfit of $5 \times 10^{-3}$ or less at the region extending from the p-n hetero junction to a distance of carrier diffusion length (about 0.5 microns) within the window layer; a first electrode partially provided on a top surface of the window layer permitting exit of light emitted from an emitting region of the active layer through the window layer; and a second electrode provided on a bottom surface of the semiconductor crystal.

DETAILED DESCRIPTION OF THE INVENTION

Figure 1:
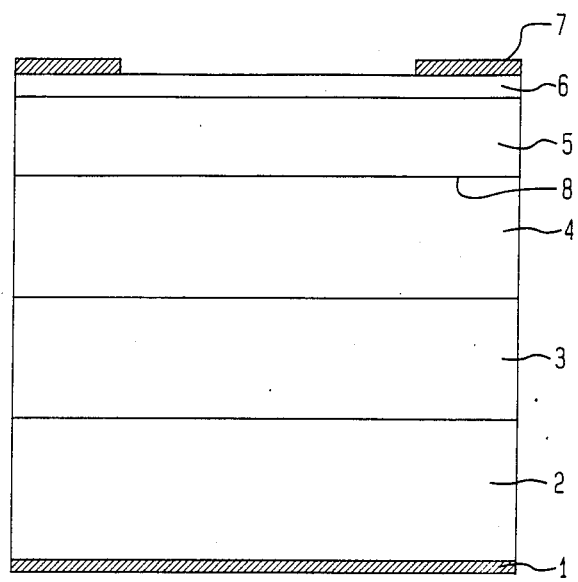
FIG. 1 shows a cross sectional view of a light emitting diode according to an embodiment of the present invention.

In order to obtain the above-described window effect to enhance the optical output from the GaAsP-LED, it is necessary to form a window layer having a larger band gap than that of the GaAsP active layer. To this end, two-element to four-element compound semiconductors such as GaP, AlP, GaAlAs, GaAlP, GaSbP, InAlP, InGaP, InGaAsP, GaSbAsP, and InGaAlP are conceived.

The inventors of the present invention have made these nominated compound semiconductors grow on a surface of a wafer for a conventional GaAsP LED to form a p-n hetero junction, and experimentally tested for the compound semiconductor which has the largest effect of enhancing optical output. As a result, the following facts have been proved:

(1) It is possible to enhance the optical output by employing any one of the above-described crystals due to the window effect.

(2) When a lattice misfit with respect to a lattice constant of GaAsP exceeds about $5 \times 10^{31\ 3}$, the effect of enhancing the optical output is reduced due to low quantum efficiency. To this end, GaP and AlP are not good.

(3) In the case of a material containing Al, even if the lattice misfit is made $5 \times 10^{31\ 3}$ or less, a reproducibility in enhancement of the optical output is not good.

(4) There are some compound semiconductors which were impossible to make good mirror surface growth due to existence of a miscibility although the window effect could be expected, such as GaSbP, GaSbAsP and InGaSbP.

(5) The materials which enhance the optical output with good reproducibility are either InGaP or InGaAsP when those compositions are adjusted so that a lattice misfit between the GaAsP active layer and either one of these window layers is $5 \times 10^{-3}$ or less.

(6) The thickness of the window layer is chosen preferably to be at least about 0.5 micron which corresponds to a carrier diffusion length therein, and even if it is increased up to 5 microns or more, enhancement of the optical output due to carrier confining effect is not significant.

(7) When the lattice misfit is kept to be $5 \times 10^{-3}$ or less at least in the thickness range of 0.5 to 1 micron of the portion making contact with the GaAsP active layer, then the carrier confining effect was sufficiently large, and even if the lattice misfit is greater than $5 \times 10^{-3}$ at the portion farther remote from the p-n hetero junction, remarkable degradation of internal luminesent efficiency is not observed.

From the above-described experiments, it has been proved that either InGaP or InGaAsP is suitable for the window layer of the GaAsP-LED. It is favourable to select the lattice misfit of the InGaP and InGaAsP to be $5 \times 10^{-3}$ or less at the region extending from the p-n hetero junction to a distance of carrier diffusion length and thereby a high optical output LED having an extremely excellent performance can be obtained.

DESCRIPTION OF PREFERRED EMBODIMENTS

In the following, preferred embodiments of the present invention will be described in greater detail by reference to the drawings:

(Embodiment 1)

Referring to FIG. 1, a commercially available wafer for GaAsP LED, which has an n-type $GaAs_{0.61}P_{0.39}$ active layer 4 on an n-type $GaAs_xP_{l-x}$ graded layer 3 (x varies from 1.0 to 0.61 toward the active layer 4) provided on an n-type GaAs substrate 2, is chemically etched by a few microns by means of a bromomethanol liquid. Immediately after the etching, a p-type InGaP layer 5 is grown up to 3 microns in thickness in a halogen transport vapor growth apparatus employing In/Ga/HCl/PH$_3$/ AsH$_3$/H$_2$ system. The composition of the entire InGaP layer 5 is adjusted so that a lattice misfit at a p-n hetero junction 8 is suppressed to $1 \times 10^{-3}$ or less. In this embodiment, the lattice misfit is made to be constant along the direction of thickness of the InGaP layer 5. Zinc (Zn) is diffused from the top surface of the InGaP layer 5 to form a $p^+$-diffusion region 6 of one micron thickness. Then an Au/Zn alloy electrode 7 is provided thereon while an Au/Sn alloy electrode 1 is provided on the n-type GaAs substrate 2. According to the LED of this embodiment, the optical output of 200 to 300 millicandelas is obtained at a carrier injection current of 20 mA. Since a commercially available GaAsP-LED has the optical output of 50 to 100 millicandelas, enhancement of the optical output by two to six times is achieved.

(Embodiment 2)

Figure 2:
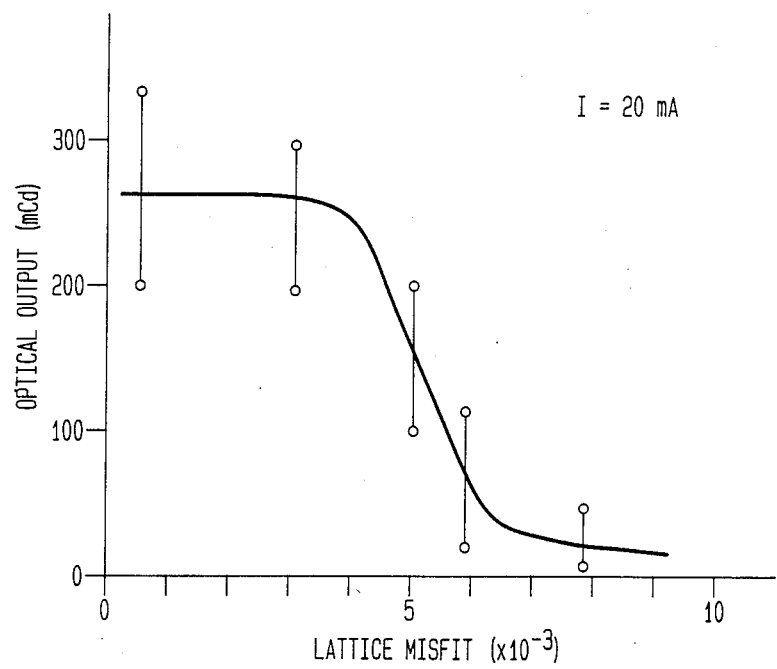
FIG. 2 shows a characteristic curve of lattice misfit dependence of LED optical output

A commercially available wafer for GaAsP LED as indicated in Embodiment 1 is employed and the same procedures as disclosed in Embodiment 1 are repeated. In this embodiment, however, five different LED's are made by selecting five different values of the lattice misfit of $8 \times 10^{-3}$, $6 \times 10^{-3}$, $5 \times 10^{-3}$, $3 \times 10^{-3}$ and $0.5 \times 10^{-3}$ in the InGaP layer 5 at the portion of 0.5 microns in thickness making contact with the GaAsP active layer 4. By measuring optical output of the respective LED's at the same condition of Embodiment 1 described above, the optical output of 100 to 300 millicandelas are obtained only in the case where the lattice mismatching was $5 \times 10^{-3}$ or less as shown in FIG. 2. When the lattice misfit exceeds the level of $5 \times 10^{-3}$, misfit dislocation is greatly increased between InGaP layer 5 and GaAsP layer 4 and thereby reducing the optical output due to low luminescent efficiency.

(Embodiment 3)

A commercially available wafer for GaAsP LED as disclosed in Embodiment 1 is employed and the same procedures of Embodiment 1 are repeated. However, in place of the p-type InGaP layer 5 in FIG. 1, a p-type InGaAsP layer is grown up to a thickness of 5 microns. Compound of the InGaAsP layer is adjusted so that the band gap is 2.07 eV and the lattice misfit is made to be constant of $5 \times 10^{-3}$ along the direction of thickness. An optical output at the carrier injection current of 20 mA is 300 to 400 millicandelas, which is larger than that in Embodiments 1 and 2 described above. This is considered to owe to the fact that InGaAsP is more advantageous for mitigating surface unevenness or lattice distortion than InGaP and hence the introduction of misfit dislocation in InGaAsP layer is less than that in InGaP layer.

(Embodiment 4)

A p-type $GaAs_xP_{1-x}$ graded layer (x varies from 1.0 to 0.61) and a p-type $GaAs_{0.61}P_{0.39}$ active layer (Zn dope) are grown on a p-type GaAs substrate to form a similar multi-layer structure as shown in FIG. 1. Subsequently, an n-type InGaP window layer, which has lattice misfit of $1 \times 10^{-3}$ or less, is grown on the p-type $GaAs_{0.61}P_{0.39}$ active layer up to a thickness of 5 microns. Since the GaAsP-LED of this embodiment has an opposite conductivity type to that in Embodiment 1, a $p^+$-diffusion layer is formed on the p-type GaAs substrate to form an Au/Zn alloy electrode, and an Au/Ge/Ni alloy electrode is formed on the n-type InGaP layer. According to this embodiment, an optical output of 400 to 800 millicandelas is obtained at a carrier injection current of 20 mA. This embodiment has proved the fact that n-type window layer achieves higher optical output. This fact has been also found in the case of opposite conductively type to that in Embodiment 3.

(Embodiment 5)

A p-type GaP layer of 2 microns in thickness, a p-type $GaAs_xP_{1-x}$ graded layer (x varies from 0 to 0.61) of 60 microns in thickness, a constant composition p-type $GaAs_{0.61}P_{0.39}$ active layer of 20 microns in thickness and an n-type InGaAsP window layer of 5 microns in thickness are successively grown on a p-type GaP substrate by means of a halogen transport vapor growth system. Starting from this wafer, LED chips are manufactured through the procedures used in Embodiment 4. According to this embodiment, a high optical output of 900 to 1800 millicandelas is obtained at a carrier injection current of 20 mA. In this embodiment, owing to the fact that the GaAsP graded layer and GaP substrate have larger band gap than that of the GaAsP active layer, light emitted towards the substrate cannot be absorbed by the graded layer and substrate. Therefore, the light is reflected by the rear surface electrode and emitted through the n-type InGaAsP window layer. For this reason, a higher optical output is obtained in this embodiment.

(Embodiment 6)

Figure 3:
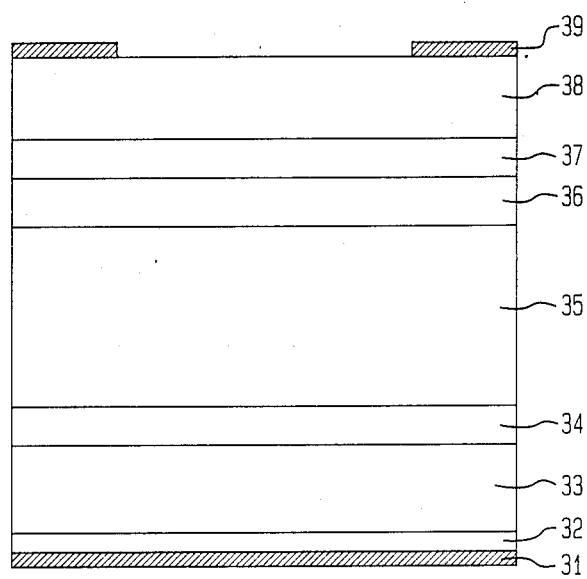
FIG. 3 shows a cross-sectional view of a light emitting diode according to another embodiment of the present invention.

Referring to FIG. 3,a p-type GaP layer 34 of 2 microns in thickness, a p-type $GaAs_xP_{1-x}$ graded layer 35 (x varies from 0 to 0.61) of 60 microns in thickness, a p-type InGaAsP clad layer confining layer 36 of 3 microns in thickness, p-type $GaAs_{0.61}P_{0.39}$ active layer 37 of 2 to 3 microns in thickness and an n-type InGaAsP window layer 38 of 5 microns in thickness are successively grown on a p-type GaP substrate 33 by means of a halogen transport vapor growth system. Both of the p-type and n-type InGaAsP layers have lattice misfit of $5 \times 10^{-3}$ or less. Starting from this wafer, LED chips are manufactured through the procedures used in the Embodiment 4. Zinc is diffused from the bottom of the GaP substrate 33 to form a p+ diffusion layer 32, whereupon an Au/Zn alloy electrode 1 is formed. An Au/Ge/Ni alloy electrode 39 is formed on the window layer 38. According to this embodiment, the thin GaAsP active layer is sandwiched between a pair of InGaAsP layers having band gap larger than that of GaAsP active layer and thereby forming a double hetero junction structure. For this reason, a high optical output exceeding 3000 millicandelas is obtained at a carrier injection current of 20 mA. In this embodiment, it is preferable to choose the thickness of the active layer in an approximate range of the carrier diffusion length to half of the carrier diffusion length. In such double heterostructure LED as disclosed in the embodiment 6, a pair of confining layers of GaAsInP can be replaced by GaAsP and furthermore, it is possible to sandwich the GaAsP active layer by the GaInAsP layer and the GaInP layer. Furthermore, conductivity type of each layer in embodiments 3, 5 and 6 can be reversed.

In the foregoing embodiments, each LED emits a light having the same wavelength of 660 nm owing to the same active layer of $GaAs_{0.61}P_{0.39}$. Needless to say, GaAsP active layer may have other compositions which will emit light having wavelength range of 550 to 870 nm. In view of a sensitivity of human eyes, it is favorable to choose its composition corresponding to the wavelength range of 620 to 700 nm.

Although FIG. 2 indicates the lattice misfit dependence of LED optical output in the case of the embodiment 2, the similar tendency can be observed in other embodiments.

In the embodiment 4, still further enhancement of a luminescence can be achieved by providing a reflector plate of cone shape for reflecting output light upwardly around the periphery of the chip because light is also emitted from the side surfaces of the LED chip.

Since a halogen transport vapor growth system has an extremely high productivity, every one of GaAsP-LED according to the above-described embodiments can be manufactured with a very low cost as compared to conventional GaAlAs-LED which must resort to the liquid phase epitaxial growth technique. Although the cost necessitated for forming the InGaP or InGaAsP layer is increased by 50 to 100% of the cost of the conventional GaAsP LED chip, in view of the fact that the cost of the GaAlAs high optical output LED chip is 6 to 8 times as high as the cost of the conventional GaAsP LED chip, it is apparent that the GaAsP LED according to the present invention can be manufactured with an extremely low cost.

What is claimed is:

1. A light emitting diode comprising a multilayer semiconductor crystal having a p-n hetero junction structure comprising a substrate of a first conductivity type, a GaAsP graded layer of said first conductivity type formed on said substrate, an active layer of GaAsP of said first conductivity type formed on said graded layer, and a window layer of either InGaP or InGaAsP of a second conductivity type formed on said active layer;
a first electrode provided on the top surface of said crytal and having an aperture permitting the exit of light emitted from an emitting region of said active layer through said window layer; and
a second electrode provided on the bottom surface of said crystal.

2. A light emitting diode as claimed in claim 1 in which said window layer has lattice misfit of $5 \times 10^{-3}$ or less at the region extending from said p-n hetero junction to a distance of carrier diffusion length measured from said hetero junction.

3. A light emitting diode as claimed in claim 2 in which said window layer has a thickness ranging from one to five microns.

4. A light emitting diode as claimed in claim 1 in which said crystal further has another hetero junction structure comprising said active layer and a confining layer of either InGaP or InGaAsP.

5. A light emitting diode comprising:
a multilayer semiconductor crystal having a p-n hetero junction structure comprising a substrate of a first conductivity type, a GaAsP graded layer of said first conductivity type formed on said substrate, an active layer of GaAsP of said first conductivity type formed on said graded layer, and a window layer of either InGaP or InGaAsP of a second conductivity type formed on said active layer; said window layer being exposed on the top surface of said crystal and having lattice misfit of $5 \times 10^{-3}$ or less at the region adjacent to the p-n hetero junction within a distance of a carrier diffusion length in said window layer;
a first electrode partially provided on the top surface of said crystal permitting the exit of light emitted from an emitting region of said active layer through said window layer; and
a second electrode provided on the bottom surface of said crystal.

6. A light emitting diode, comprising
a multilayer semiconductor crystal inlcuding a substrate of a first conductivity type and a p-n hetero junction structure having a graded layer of aid first conductivity type arranged on said substrate, an active layer of said first conductivity type arranged on said graded layer and a window layer of a second conductivity type arranged on said active layer;
a diffusion layer formed in one of said substrate and said window layer;
a first electrode mounted on said window layer; and
a second electrode mounted on said substrate; and wherein
said active layer is formed of GaAsP and said window layer is formed of either InGaP or InGaAsP.

7. The light emitting diode of claim 6, wherein said window layer has a lattice misfit of $5 \times 10^{-3}$ or less at the region extending from said p-n hetero junction to a distance of carrier diffusion length measured from said hetero junction.

8. The light emitting diode of claim 7, wherein said window layer has a thickness of between one and five microns.

9. The light emitting diode of claim 6, wherein a confining layer of InGaP or InGaAsP is arranged between said graded layer and said active layer, thereby to form a double hetero junction structure.

10. The light emtting diode of claim 9, wherein said window layer and said confining layer each have a lattic misfit of $5 \times 10^{-3}$ or less.

11. A light emitting diode comprising
a multilayer semiconductor crystal having a p-n hetero junction structure comprising a substrate of a first conductivity type, a GaAsP graded layer of said first conductivity type formed on said substrate, an active layer of GaAsP of said first conductivity type formed on said graded layer, and a window layer of a material selected from the group of InGaP and InGaAsP and of a second conductivity type formed on said active layer;
a first electrode provided on the top surface of said crystal permitting exit of light emitted from an emitting region of said active layer through said window layer; and
a second electrode provided on the bottom surface of said crystal.

12. A light emitting diode as claimed in claim 11 in which said window layer has lattice misfit of $5 \times 10^{-3}$ or less at the region extending from said p-n hetero junction to a distance of carrier diffusion length measured from said hetero junction.

13. A light emtting diode as claimed in claim 12 in which said window layer has a thickness ranging from one to five microns.

14. A light emitting diode as claimed in claim 11 in said crystal further has another hetero junction structure consisting of said active layer and a confining layer of a material selected from the group of InGaP and InGaAsP.

* * * * *